(12) United States Patent
Chiu

(10) Patent No.: US 7,701,291 B2
(45) Date of Patent: Apr. 20, 2010

(54) GAIN IMPROVED OPERATIONAL TRANSCONDUCTANCE AMPLIFIER AND CONTROL METHOD THEREOF

(75) Inventor: Wei-Che Chiu, Hsinchu (TW)

(73) Assignee: Richtek Technology Corp., Hsinchu (TW)

( * ) Notice: Subject to any disclaimer, the term of this patent is extended or adjusted under 35 U.S.C. 154(b) by 122 days.

(21) Appl. No.: 11/987,923

(22) Filed: Dec. 6, 2007

(65) Prior Publication Data

US 2008/0136523 A1   Jun. 12, 2008

(30) Foreign Application Priority Data

Dec. 8, 2006   (TW)   ............................. 95146107 A

(51) Int. Cl.
*H03F 3/45* (2006.01)

(52) U.S. Cl. ..................... 330/261; 330/254; 330/255

(58) Field of Classification Search ............... 330/261, 330/254, 255
See application file for complete search history.

(56) References Cited

U.S. PATENT DOCUMENTS

| | | | | |
|---|---|---|---|---|
| 5,311,144 A * | 5/1994 | Grasset | ..................... | 330/252 |
| 5,587,687 A * | 12/1996 | Adams | ..................... | 330/253 |
| 6,600,373 B1 * | 7/2003 | Bailey et al. | ................ | 330/260 |
| 7,030,697 B1 * | 4/2006 | Pribytko et al. | ............. | 330/257 |
| 7,253,686 B2 * | 8/2007 | Ali | ............................. | 330/259 |
| 7,421,263 B2 * | 9/2008 | Kim | ....................... | 455/234.1 |
| 7,501,892 B2 * | 3/2009 | Otaka et al. | ................. | 330/254 |

* cited by examiner

*Primary Examiner*—Patricia Nguyen
(74) *Attorney, Agent, or Firm*—Rosenberg, Klein & Lee

(57) ABSTRACT

A variable bias current is provided for the differential pair of an operational transconductance amplifier to improve the gain performance, especially to overcome the slew rate limit of the operational transconductance amplifier. The bias current is adjusted according to the differential input to the differential pair, the difference between the currents of the differential pair, or any one of the currents of the differential pair.

18 Claims, 11 Drawing Sheets

GAIN IMPROVED OPERATIONAL TRANSCONDUCTANCE AMPLIFIER AND CONTROL METHOD THEREOF

FIELD OF THE INVENTION

The present invention is related generally to an operational transconductance amplifier (OTA) and, more particularly, to an operational transconductance amplifier without slew rate limit.

BACKGROUND OF THE INVENTION

As shown in FIG. 1, in an operational transconductance amplifier 100, a current source 110 provides a bias current I1 to a differential pair 108 of which NMOS transistors M1 and M2 are controlled by a pair of differential input voltages V_ and V_+ to produce two currents I2 and I3 respectively, a current mirror 102 composed of two PMOS transistors M3 and M4 mirrors the current I2 to produce a current I4, a current mirror 104 composed of two PMOS transistors M5 and M6 mirrors the current I3 to produce a current I5, a current mirror 106 composed of two NMOS transistors M7 and M8 mirrors the current I4 to produce a current I6, and the output current Io of the operational transconductance amplifier 100 is produced from the difference between the currents I5 and I6. The gain of the operational transconductance amplifier 100 is $$GM = \frac{dIo}{d(V_+ - V_-)}. \quad [\text{Eq-1}]$$

Ideally, the gain GM of the OTA 100 should be constant. However, in reality, the output current Io tends to be saturated with the increase of the difference between the input voltages V_+ and V_ of the OTA 100, as shown in FIG. 2, that is to say, the gain GM of the OTA 100 will be less and less and go into slew rate limit range when the difference between the input voltages V_+ and V_ becomes larger. It is because that the bias current I1 provided by the current source 110 of the OTA 100 is constant, which causes that the differential current d(I2−I3) produced by a same differential voltage d(V_+−V_) becomes less and less when the difference between the currents I2 and I3 reaches some certain value, and further causes that the variation dIo of the output current Io becomes less and less, so that the gain GM becomes less and less. For some cases, for example response to a load transient, a fast response speed is needed, whereas the OTA 100 cannot have such fast response speed due to the slew rate limit.

Therefore, an improved operational transconductance amplifier is desired.

SUMMARY OF THE INVENTION

An object of the present invention is to provide a gain improved operational transconductance amplifier.

According to the present invention, an operational transconductance amplifier comprises a variable current source or a variable voltage source connected to a differential pair such that the bias current provided for the differential pair varies with the differential input of the differential pair, thereby improving the gain in the high differential input range.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 3:
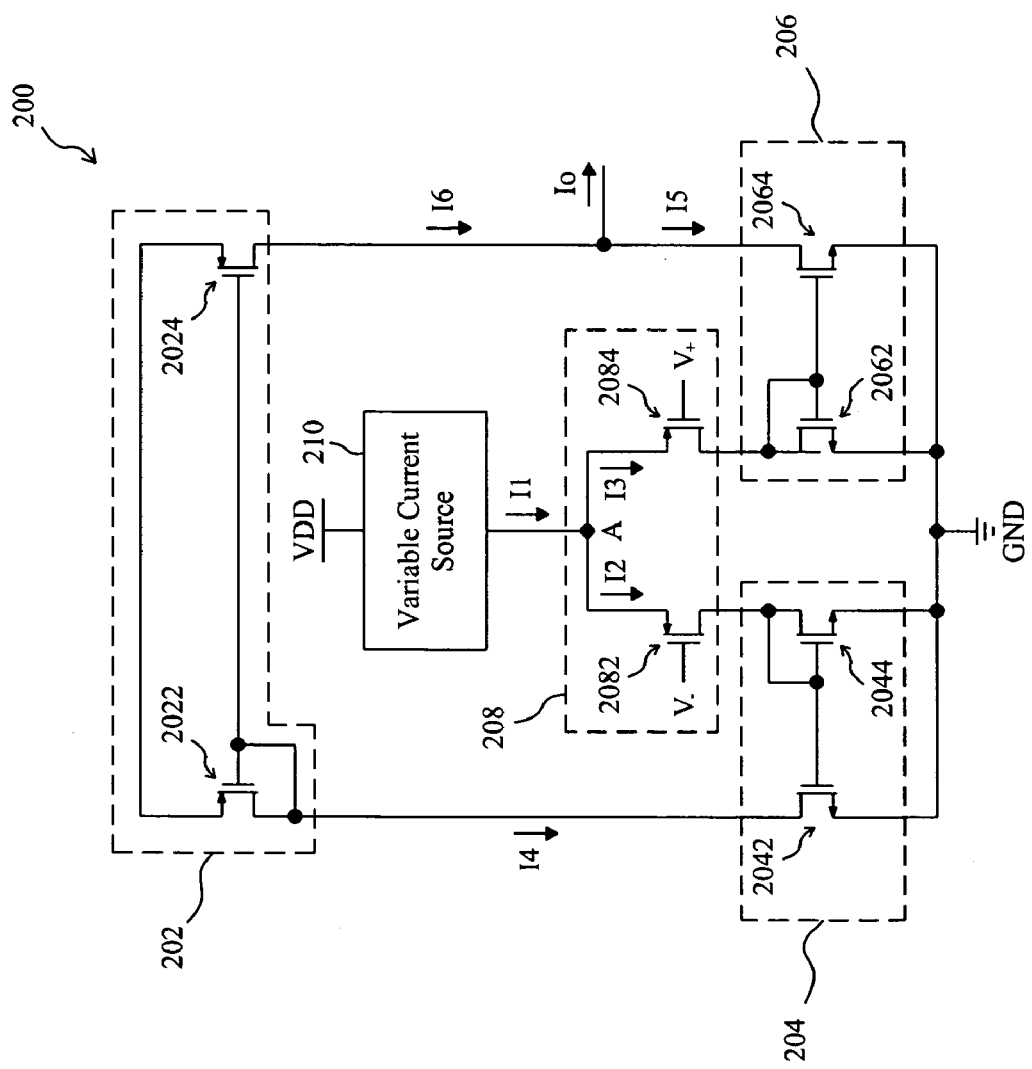
FIG. 3 shows a first embodiment OTA according to the present invention.

FIG. 3 shows a first embodiment OTA 200, which comprises a variable current source 210 to provide a variable bias current I1 to a differential pair 208 including two PMOS transistors 2082 and 2084 to produce two currents I2 and I3 according to two input voltages V_ and V_+ respectively, a current mirror 204 composed of two NMOS transistors 2042 and 2044 to mirror the current I2 to produce a current I4, a current mirror 206 composed of two NMOS transistors 2062 and 2064 to mirror the current I3 to produce a current I5, a current mirror 202 composed of two PMOS transistors 2022 and 2024 to mirror the current I4 to produce a current I6, and an output current Io produced from the difference between the currents I5 and I6. In particular, the variable current source 210 adjusts the variable bias current I1 upon the difference between the input voltages V_ and V_+.

Figure 4:
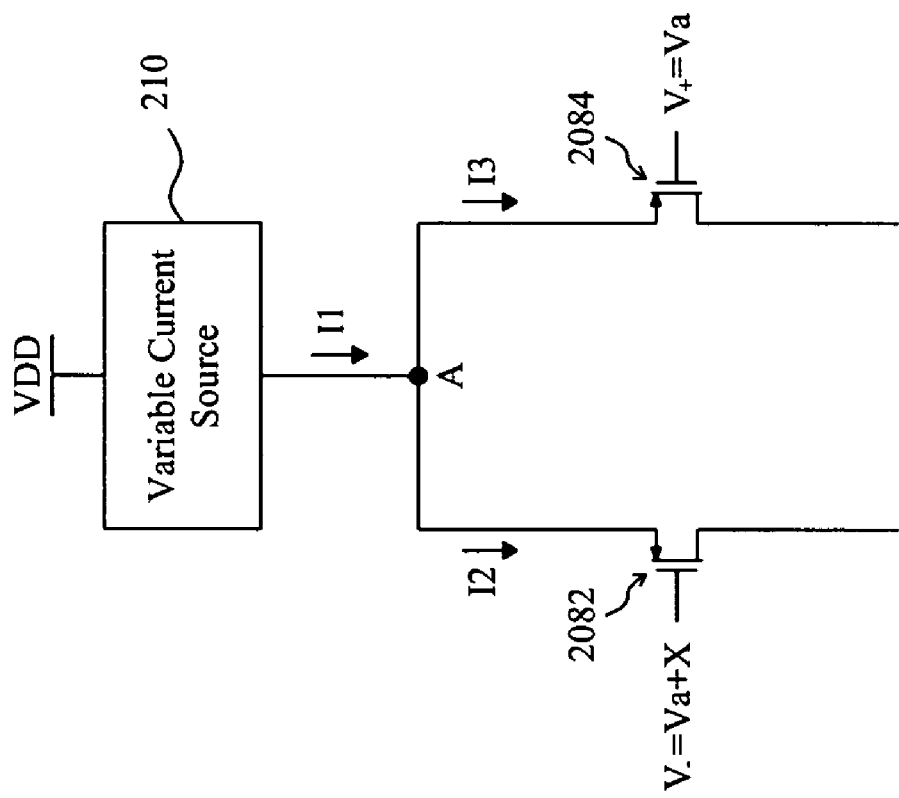
FIG. 4 shows the core circuit of FIG. 3.

FIG. 4 is the core circuit of FIG. 3. It is well know that the current following through a MOS transistor is $$I_D = K(Vgs - Vtp)^2, \quad [\text{Eq-2}]$$

where K is a constant, Vgs is the voltage between the gate and the source of the MOS transistor, and Vtp is the threshold voltage of the MOS transistor. Assuming that the voltage on node A is Y+Vtp, the voltage V_=Va+X, and the voltage V_+=Va, and if the channel-length modulation is ignored, the current following through the PMOS transistor 2082 is $$I2 = K(Va+X-Y)^2, \quad [\text{Eq-3}]$$

and the current following through the PMOS transistor 2084 is $$I3 = K(Va-Y)^2. \quad [\text{Eq-4}]$$

If the gain GM of the OTA 2C0 is constant, d(I2−I3)/dX is also constant, and therefore (I2−I3) is a linear function of X. By subtracting the equation Eq-4 from the equation Eq-3, it has $$I2-I3 = K(Va+X-Y)^2 - K(Va-Y)^2. \quad [\text{Eq-5}]$$

the equation Eq-5 can be simplified as $$(I2-I3)/K = X^2 + 2X(Va-Y). \quad [\text{Eq-6}]$$

As mentioned in the above description, to have a constant gain GM, (I2−I3) must be a linear function of X. To eliminate the term $X^2$ in the equation Eq-6, it will have $$Y = \text{const} + (\tfrac{1}{2})X, \quad [\text{Eq-7}]$$

where const is a constant. From the equation Eq-7, it can be know that when the difference between the input voltages $V_-$ and $V_+$ increases, the voltage on the node A will increase a half of the difference.

Figure 5:
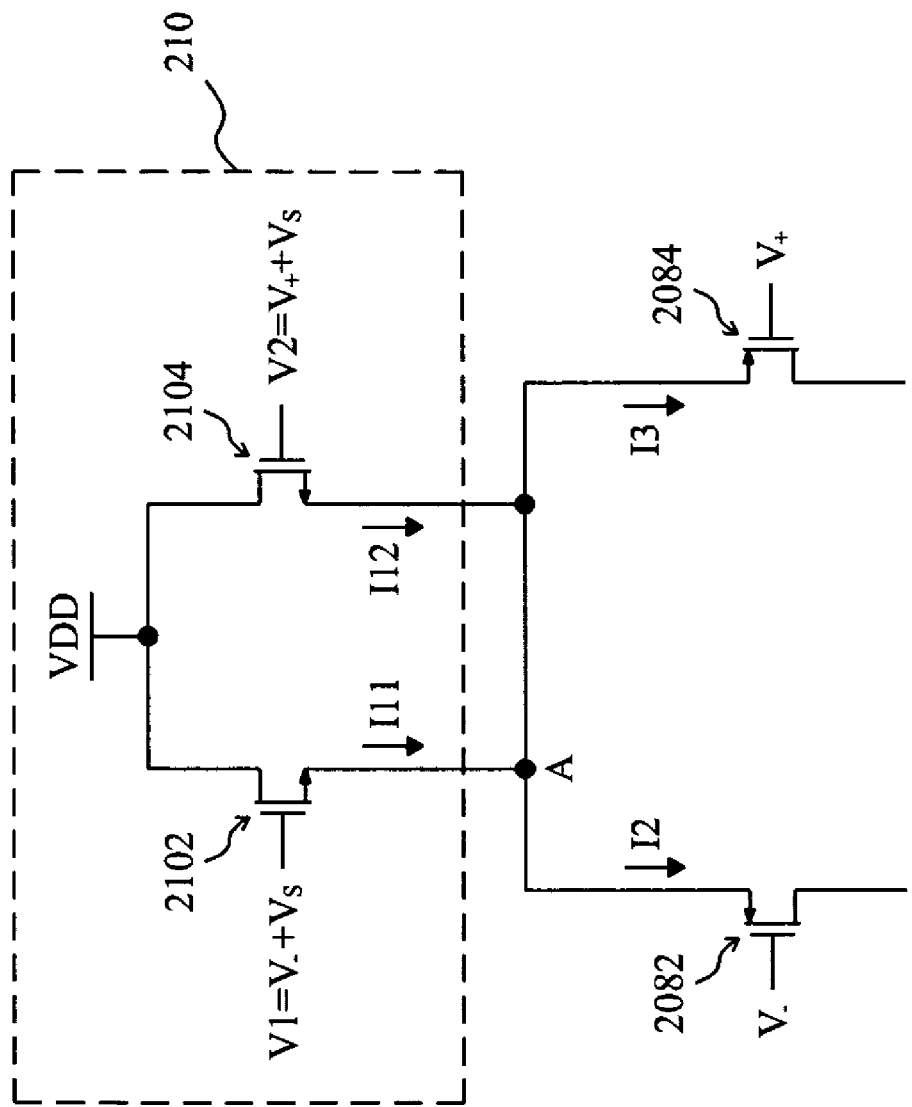
FIG. 5 shows a first embodiment for the variable current source shown in FIG. 4.

FIG. 5 shows a first embodiment for the variable current source 210, in which two NMOS transistors 2102 and 2104 are so arranged to produce two currents I11 and I12 upon the voltages V1=$V_-$+Vs and V2=$V_+$+Vs respectively, where the voltage Vs is constant, and the currents I11 and I12 converge to be the bias current I1. Assuming that the PMOS transistor 2082 has a transconductance gmp1, the PMOS transistor 2084 has a transconductance gmp2, the NMOS transistor 2102 has a transconductance gmn1, the NMOS transistor 2104 has a transconductance gmn2, gmn1=gmp2, and gmn2=gmp1, when the differential input $V_-$ or $V_+$ changes, the voltage V1 or V2 will change accordingly, and the voltage on the node A will also change to reach a balance between the currents I11 and I12 and the currents I2 and I3. Because gmn1=gmp2 and gmn2=gmp1, when the difference between the input voltages $V_-$ and $V_+$ changes, the voltage variation on the node A will be a half of the variation of the differential input.

Figure 6:
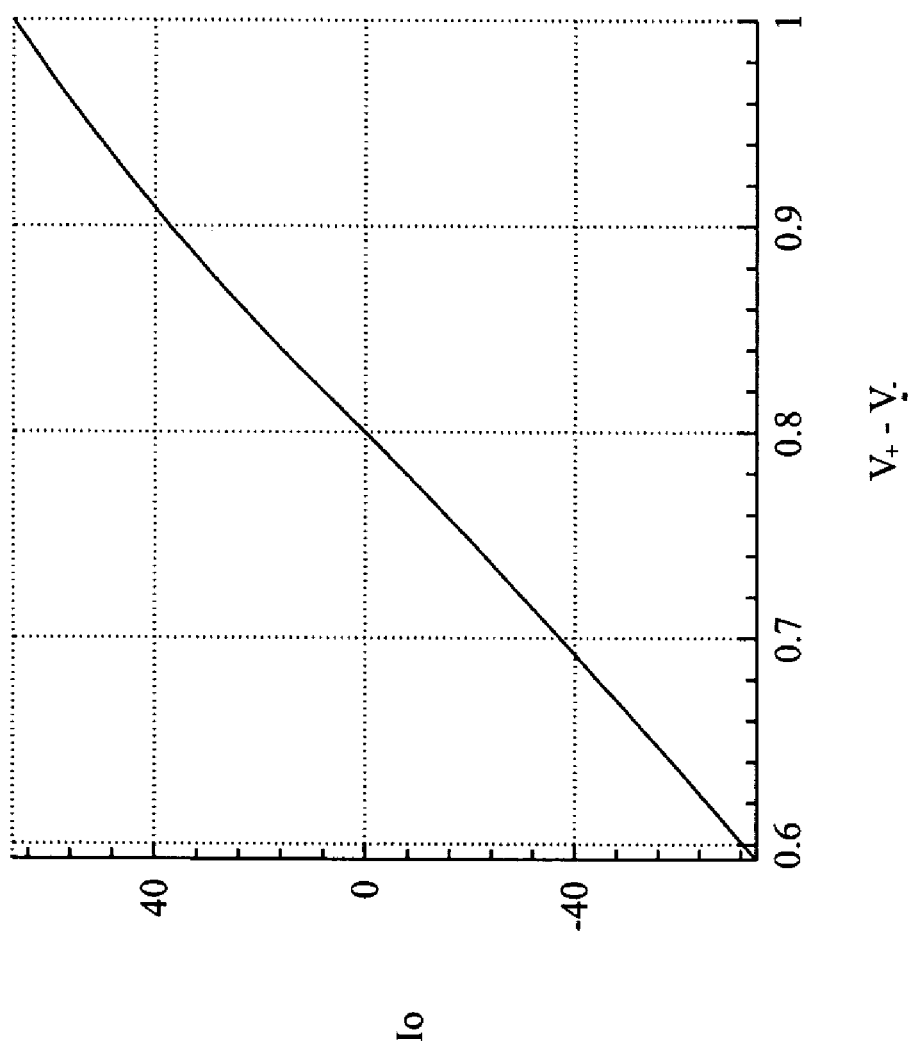
FIG. 6 shows a simulation of the relationship between the output current and the differential input of the circuit of FIG. 5.

FIG. 6 shows a simulation of the relationship between the output current Io and the differential input ($V_+$−$V_-$) of the circuit of FIG. 5, in which the output current Io and the differential input ($V_+$−$V_-$) have a substantially linear relationship, and the gain GM is substantially constant.

Figure 7:
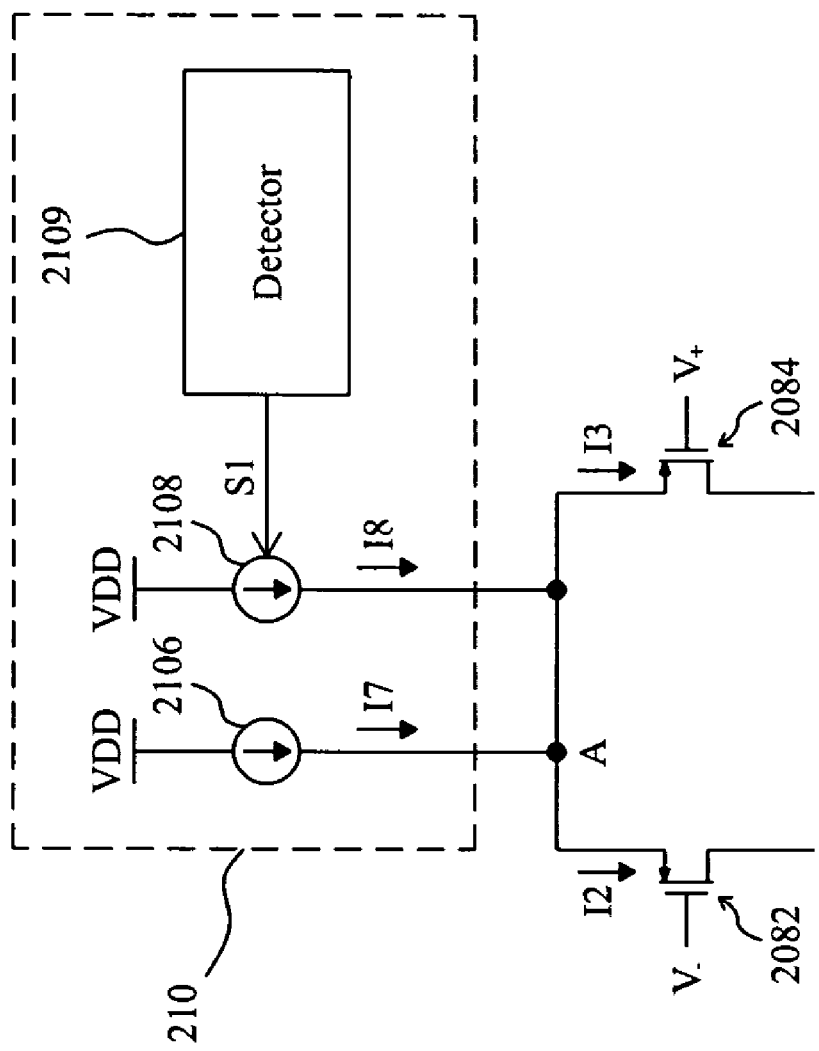
FIG. 7 shows a second embodiment for the variable current source shown in FIG. 4.

In some cases, for example a load transient happens, a greater gain GM is needed to increase the response speed when the difference between the input voltages $V_+$ and $V_-$ is greater. FIG. 7 shows a second embodiment for the variable current source 210, which includes two current sources 2106 and 2108 for providing two currents I7 and I8 to converge to be the bias current I1, and a detector 2109 for detecting the input voltages $V_+$ and $V_-$, or the currents I2 and I3, in order to control the current source 2108. In this embodiment, the current source 2108 is enabled by the detector 2109 to produce the current I8 to the node A only when the input voltages $V_+$ and $V_-$ or the currents I2 and I3 meet some certain conditions, for example, the difference between the input voltages $V_+$ and $V_-$ reaches some certain value, the difference between the currents I2 and I3 reaches some certain value, or one of the currents I2 and I3 is lower than some certain value, by which the gain GM is increased, and the current I8 will increase with the increase of the absolute value of the difference between the input voltages $V_+$ and $V_-$ or the difference between the currents I2 and I3. This embodiment is available for the burst gain application.

Figure 1:
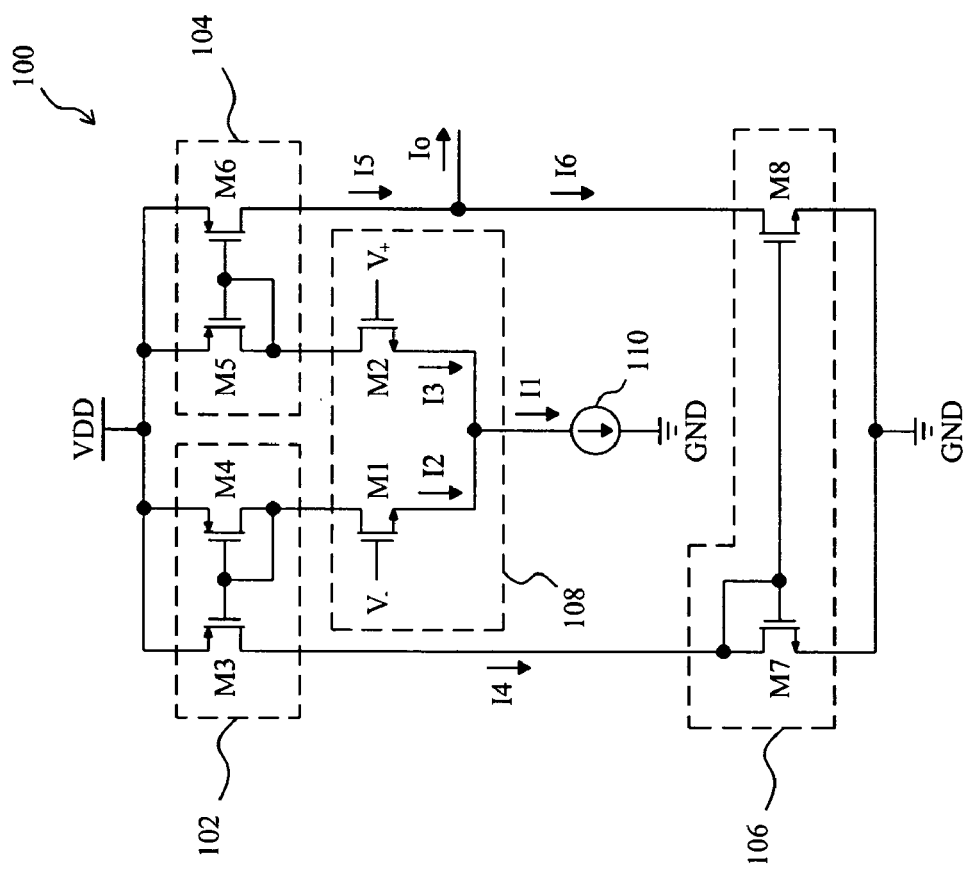
FIG. 1 shows a conventional operational transconductance amplifier.
Figure 2:
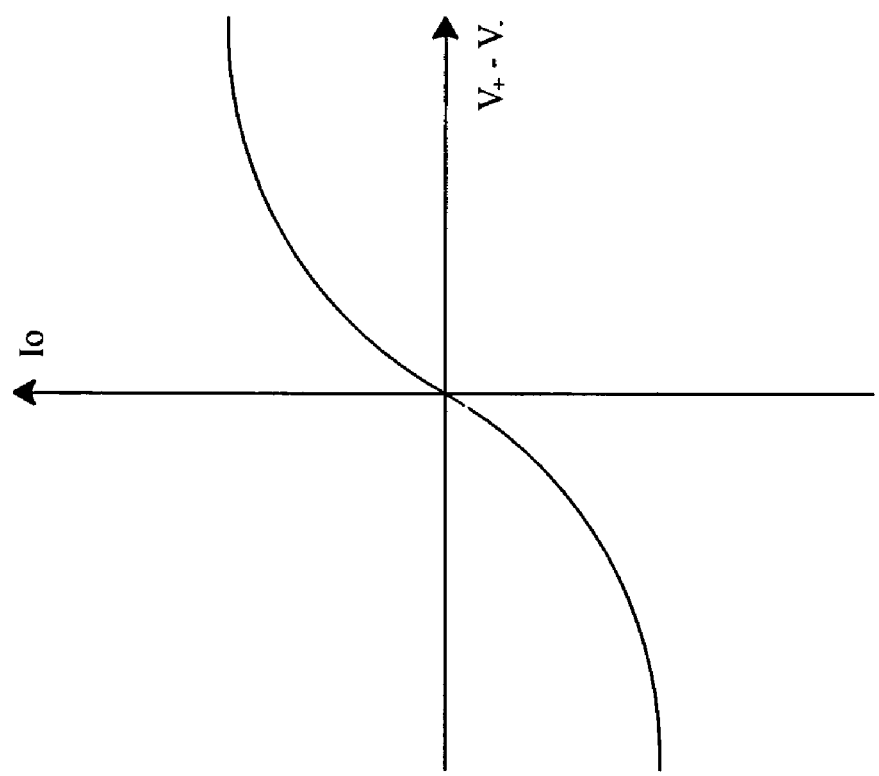
FIG. 2 shows the relationship between the differential input and the output current of a conventional OTA.
Figure 8:
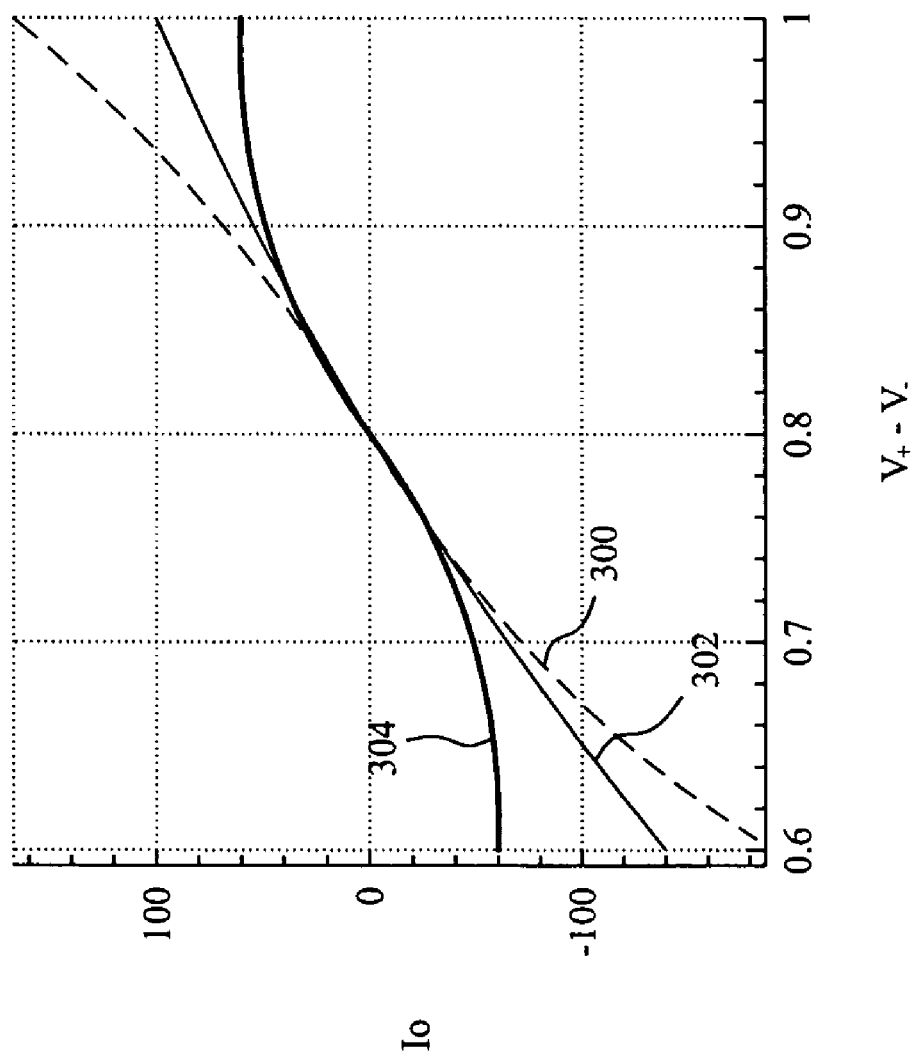
FIG. 8 shows a gain performance comparison between the embodiments of the present invention and the conventional OTA of FIG. 1.
Figure 9:
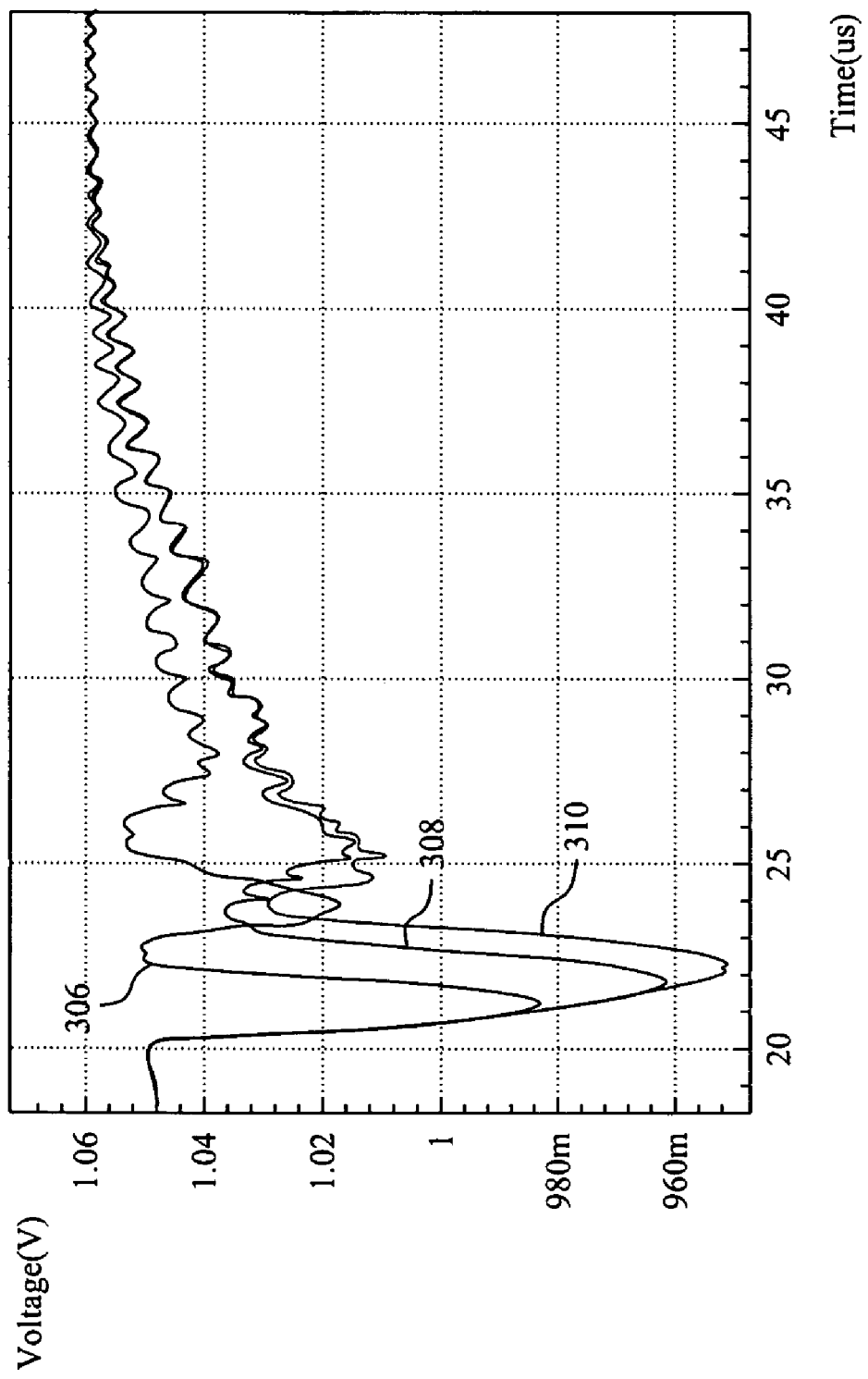
FIG. 9 shows an output performance comparison between the embodiments of the present invention and the conventional OTA of FIG. 1.

FIG. 8 shows a gain performance comparison between the embodiments of the present invention and the OTA 100 of FIG. 1, in which curve 300 represents the relationship between the differential input ($V_+$−$V_-$) and the output current Io of the OTA 200 using the circuit of FIG. 7, curve 302 represents the relationship between the differential input ($V_+$−$V_-$) and the output current Io of the OTA 200 using the circuit of FIG. 5, and curve 304 represents the relationship between the differential input ($V_+$−$V_-$) and the output current Io of the OTA 100 of FIG. 1. As shown in FIG. 8, the gain GM of the OTA 200 of the present invention is improved. FIG. 9 shows an output performance comparison between the embodiments of the present invention and the OTA 100 of FIG. 1, in which a curve 306 represents the voltage on the output load of the OTA 200 using the circuit of FIG. 7, curve 308 represents the voltage on the output load of the OTA 200 using the circuit of FIG. 5, and curve 310 represents the voltage on the output load of the OTA 100 of FIG. 1. As shown in FIG. 8, when the load transient happens at time 20 us, the response speed of the OTA 200 of the present invention is improved.

Figure 10:
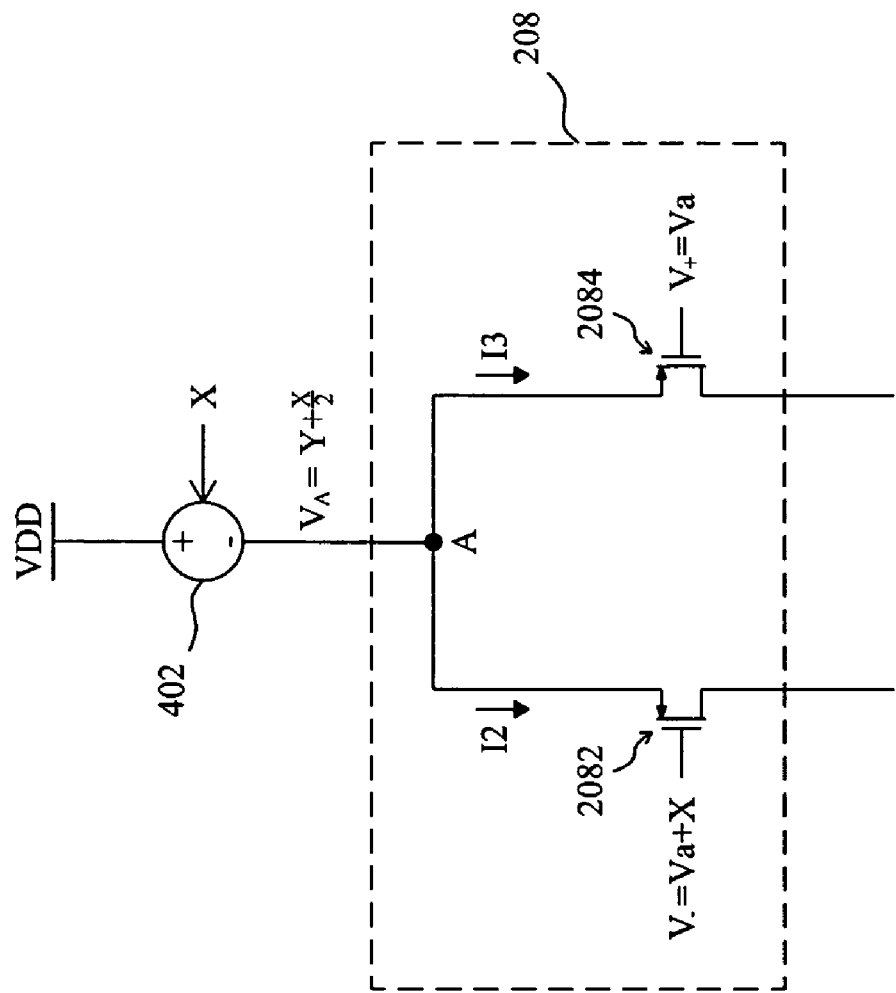
FIG. 10 shows a second embodiment OTA according to the present invention.

FIG. 10 shows a second embodiment OTA, which comprises a differential pair connected with a variable voltage source 402 to adjust the bias voltage $V_A$ on the common source node A as Y+(X/2) under the control of the difference X between the input voltages $V_+$ and $V_-$, where Y is a constant. In this embodiment, the operational transconductance amplifier will have a stable gain GM.

Figure 11:
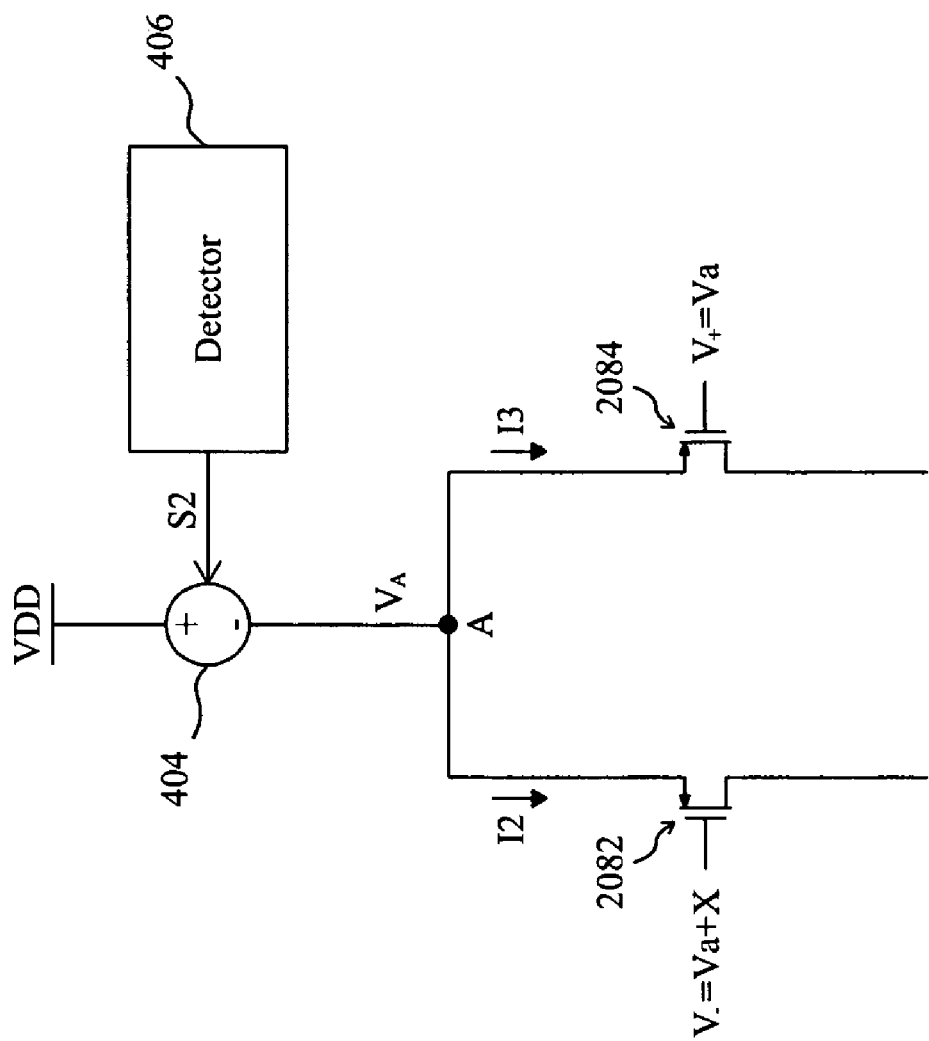
FIG. 11 is another embodiment by modifying the circuit of FIG. 10.

FIG. 11 is another embodiment, in which a variable voltage source 404 is used to control the bias voltage $V_A$ on the common source node A of the differential pair, and a detector 406 detects the difference between the input voltages $V_+$ and $V_-$, the difference between the currents I2 and I3, or the value of the currents I2 and I3, in order to produce a signal S2 to control the voltage source 404 to adjust the bias voltage $V_A$. For example, when the difference between the input voltages $V_+$ and $V_-$ or the difference between the currents I2 and I3 reaches some certain value, or one of the currents I2 and I3 is lower than some certain value, the voltage source 404 will pulls high the bias voltage $V_A$. This embodiment is also available for the burst gain application.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An operational transconductance amplifier comprising:
   a differential pair controlled by a first input voltage and a second input voltage respectively; and
   a variable current source for providing a variable bias current to the differential pair, so as to control a gain of the operational transconductance amplifier;
   wherein the differential pair splits the variable bias current into a first current and a second current upon the first input voltage and the second input voltage, and the differential pair has a common source on which a voltage varies as much as a half of a difference between the first input voltage and the second input voltage.

2. An operational transconductance amplifier comprising:
   a differential pair controlled by a first input voltage and a second input voltage respectively; and
   a variable current source for providing a variable bias current to the differential pair, so as to control a gain of the operational transconductance amplifier;

wherein the differential pair splits the variable bias current into a first current and a second current upon the first input voltage and the second input voltage, and the variable bias current varies when a difference between the first current and the second current reaches a predetermined value.

3. An operational transconductance amplifier comprising:
a differential pair controlled by a first input voltage and a second input voltage respectively; and
a variable current source for providing a variable bias current to the differential pair, so as to control a gain of the operational transconductance amplifier;
wherein the differential pair splits the variable bias current into a first current and a second current upon the first input voltage and the second input voltage, and the variable bias current varies when a difference between the first input voltage and the second input voltage reaches a predetermined value.

4. An operational transconductance amplifier comprising:
a differential pair controlled by a first input voltage and a second input voltage respectively; and
a variable current source for providing a variable bias current to the differential pair, so as to control a gain of the operational transconductance amplifier;
wherein the differential pair splits the variable bias current into a first current and a second current upon the first input voltage and the second input voltage, and the variable bias current varies when the first current or the second current reaches a predetermined value.

5. A control method for an operational transconductance amplifier having a differential pair for producing a first current and a second current upon a first input voltage and a second input voltage, the control method comprising the steps of:
providing a bias current to the differential pair; and
adjusting the bias current for controlling a gain of the operational transconductance amplifier;
wherein the differential pair has a common source on which a voltage varies as much as a half of a difference between the first input voltage and the second input voltage.

6. A control method for an operational transconductance amplifier having a differential pair for producing a first current and a second current upon a first input voltage and a second input voltage, the control method comprising the steps of:
providing a bias current to the differential pair; and
adjusting the bias current for controlling a gain of the operational transconductance amplifier;
wherein the bias current varies when a difference between the first input voltage and the second input voltage reaches a predetermined value.

7. A control method for an operational transconductance amplifier having a differential pair for producing a first current and a second current upon a first input voltage and a second input voltage, the control method comprising the steps of:
providing a bias current to the differential pair; and
adjusting the bias current for controlling a gain of the operational transconductance amplifier;
wherein the bias current varies when a difference between the first current and the second current reaches a predetermined value.

8. A control method for an operational transconductance amplifier having a differential pair for producing a first current and a second current upon a first input voltage and a second input voltage, the control method comprising the steps of:
providing a bias current to the differential pair; and
adjusting the bias current for controlling a gain of the operational transconductance amplifier;
wherein the bias current varies when the first current or the second current reaches a predetermined value.

9. An operational transconductance amplifier comprising:
a differential pair having a first input connected with a first input voltage, and a second input connected with a second input voltage; and
a variable voltage source for providing a variable bias voltage to the differential pair, so as to control a gain of the operational transconductance amplifier;
wherein the variable bias voltage varies with a difference between the first input voltage and the second input voltage.

10. The operational transconductance amplifier of claim 9, wherein the variable bias voltage varies as much as a half of a variation of the difference between the first input voltage and the second input voltage.

11. An operational transconductance amplifier comprising:
a differential pair having a first input connected with a first input voltage, and a second input connected with a second input voltage;
a variable voltage source for providing a variable bias voltage to the differential pair, so as to control a gain of the operational transconductance amplifier; and
a detector for detecting a difference between the first input voltage and the second input voltage in order to adjust the variable bias voltage when the difference between the first input voltage and the second input voltage reaches a predetermined value.

12. An operational transconductance amplifier comprising:
a differential pair having a first input connected with a first input voltage, and a second input connected with a second input voltage; and
a variable voltage source for providing a variable bias voltage to the differential pair, so as to control a gain of the operational transconductance amplifier;
wherein the differential pair produces a first current and a second current based on the first input voltage, the second input voltage and the variable bias voltage, so as to adjust the variable bias voltage when a difference between the first current and the second current reaches a predetermined value.

13. An operational transconductance amplifier comprising:
a differential pair having a first input connected with a first input voltage, and a second input connected with a second input voltage; and
a variable voltage source for providing a variable bias voltage to the differential pair, so as to control a gain of the operational transconductance amplifier;
wherein the differential pair produces a first current and a second current based on the first input voltage, the second input voltage and the bias voltage, so as to adjust the variable bias voltage when the first current or the second current reaches a predetermined value.

14. A control method for an operational transconductance amplifier having a differential pair to receive a first input voltage and a second input voltage, the control method comprising the steps of:

providing a bias voltage to the differential pair; and
adjusting the bias voltage for controlling a gain of the operational transconductance amplifier;
wherein the bias voltage varies with a difference between the first input voltage and the second input voltage.

15. The control method of claim 14, wherein the bias voltage varies as much as a half of the difference between the first input voltage and the second input voltage.

16. A control method for an operational transconductance amplifier having a differential pair to receive a first input voltage and a second input voltage, the control method comprising the steps of:
providing a bias voltage to the differential pair;
adjusting the bias voltage for controlling a gain of the operational transconductance amplifier; and
detecting a difference between the first input voltage and the second input voltage, in order to adjust the bias voltage when the difference between the first input voltage and the second input voltage reaches a predetermined value.

17. A control method for an operational transconductance amplifier having a differential pair to receive a first input voltage and a second input voltage, the control method comprising the steps of:
providing a bias voltage to the differential pair;
adjusting the bias voltage for controlling a gain of the operational transconductance amplifier;
producing a first current and a second current based on the first input voltage, the second input voltage, and the bias voltage; and
detecting a difference between the first current and the second current, in order to adjust the bias voltage when the difference between the first input voltage and the second input voltage reaches a predetermined value.

18. A control method for an operational transconductance amplifier having a differential pair to receive a first input voltage and a second input voltage, the control method comprising the steps of:
providing a bias voltage to the differential pair;
adjusting the bias voltage for controlling a gain of the operational transconductance amplifier;
producing a first current and a second current based on the first input voltage, the second input voltage, and the bias voltage; and
detecting the first current and the second current, in order to adjust the bias voltage when the first current or the second current reaches a predetermined value.

* * * * *